(12) United States Patent
Kwon

(10) Patent No.: US 8,293,625 B2
(45) Date of Patent: Oct. 23, 2012

(54) STRUCTURE AND METHOD FOR HARD MASK REMOVAL ON AN SOI SUBSTRATE WITHOUT USING CMP PROCESS

(75) Inventor: Oh-Jung Kwon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/009,056

(22) Filed: Jan. 19, 2011

(65) Prior Publication Data

US 2012/0181665 A1 Jul. 19, 2012

(51) Int. Cl.
*H01L 21/20* (2006.01)
*H01L 21/36* (2006.01)

(52) U.S. Cl. ........ 438/479; 438/430; 438/637; 438/639; 257/E21.597

(58) Field of Classification Search .................. 438/430, 438/479, 637, 639; 257/E21.597
See application file for complete search history.

(56) References Cited

U.S. PATENT DOCUMENTS

| | | |
|---|---|---|
| 5,614,431 A | 3/1997 | DeBrosse |
| 5,874,758 A | 2/1999 | DeBrosse |
| 6,066,526 A | 5/2000 | Hakey et al. |
| 6,232,171 B1 | 5/2001 | Mei |
| 6,245,640 B1 | 6/2001 | Claussen et al. |
| 6,365,485 B1 | 4/2002 | Shiao et al. |
| 6,391,706 B2 | 5/2002 | Wu et al. |
| 6,413,835 B1 | 7/2002 | Norstrom et al. |
| 6,440,792 B1 | 8/2002 | Shiao et al. |
| 6,440,858 B1 | 8/2002 | Canale et al. |
| 6,503,813 B1 | 1/2003 | Koburger, III |
| 6,528,367 B1 | 3/2003 | Lee |
| 6,660,581 B1 | 12/2003 | Yang et al. |
| 6,696,365 B2 | 2/2004 | Kumar et al. |
| 6,732,550 B2 | 5/2004 | Won |
| 6,770,541 B1 | 8/2004 | Yin et al. |
| 6,964,926 B2 | 11/2005 | Huang et al. |
| 6,995,449 B1 | 2/2006 | Yin et al. |
| 7,015,115 B1 | 3/2006 | Yin et al. |
| 7,029,753 B2 | 4/2006 | Tzou et al. |
| 7,078,290 B2 | 7/2006 | Weis |
| 7,101,806 B2 | 9/2006 | Cline et al. |
| 7,109,097 B2 | 9/2006 | Paranjpe et al. |
| 7,341,952 B2 | 3/2008 | Tzou et al. |
| 7,402,522 B2 | 7/2008 | Hsieh et al. |
| 7,413,943 B2 | 8/2008 | Kim et al. |
| 7,439,588 B2 * | 10/2008 | Ban et al. ................ 257/351 |
| 7,446,366 B2 | 11/2008 | Paranjpe et al. |
| 7,575,970 B2 | 8/2009 | Ho et al. |
| 7,579,280 B2 | 8/2009 | Brask et al. |
| 7,642,158 B2 | 1/2010 | Parascandola et al. |
| 7,648,886 B2 | 1/2010 | Ngo et al. |
| 7,713,881 B2 | 5/2010 | Paranjpe et al. |
| 7,736,954 B2 | 6/2010 | Hussain et al. |
| 2004/0126986 A1 * | 7/2004 | Wise et al. ................ 438/424 |
| 2010/0122303 A1 * | 5/2010 | Maloney ................... 725/87 |
| 2010/0133609 A1 * | 6/2010 | Gilgen et al. .............. 257/330 |

* cited by examiner

*Primary Examiner* — Alexander Ghyka
*Assistant Examiner* — Stanetta Isaac
(74) *Attorney, Agent, or Firm* — Joseph Petrokaitis

(57) ABSTRACT

A hard mask material is removed from an SOI substrate without using a chemical mechanical polish (CMP) process. A blocking material is deposited on a hard mask material after a deep trench reactive ion etch (RIE) process. The blocking material on top of the hard mask material is removed. A selective wet etching process is used to remove the hard mask material. Trench recess depth is effectively controlled.

20 Claims, 10 Drawing Sheets

STRUCTURE AND METHOD FOR HARD MASK REMOVAL ON AN SOI SUBSTRATE WITHOUT USING CMP PROCESS

BACKGROUND OF THE INVENTION

The present invention relates generally to a method for removing a hard mask on an SOI substrate without using a chemical mechanical polish (CMP) process.

For embedded DRAM (eDRAM) processing in 22 nm technology and beyond, a conventional spacer at a sidewall of a deep trench cannot be used to etch the deep trench sufficiently. Without the spacer at the sidewall of the deep trench, it is difficult to remove a hard mask material. When etching a deep trench in an SOI substrate, it is difficult to remove the hard mask material due to the presence of a BOX layer. Conventional methods of hard mask removal on bulk substrates use a wet process. Borosilicate glass (BSG) is typically used as the hard mask material. BSG can be easily etched by a wet process, such as hydrofluoric acid (HF) or buffered hydrofluoric acid (BHF). Since the SOI substrate has the BOX layer, the wet process cannot be used. A CMP process may be used to remove the hard mask material. However, the CMP process results in hard mask thickness variation because of variation in the CMP process itself and hard mask material thickness non-uniformity. CMP process non-uniformity causes recess depth variation directly and may result in deep trench to substrate leakage current. It may also cause a deep trench to deep trench short or an exposed node dielectric by the etching process. The exposed node dielectric may result in substrate warpage by oxidation of a metal high-dielectric constant (MHK) node electrode. A two step deep trench CMP process may reduce the depth variation, but also increases cost.

SUMMARY OF THE INVENTION

In a first aspect of the invention, a method of forming a device includes providing a semiconductor-on-insulator (SOI) substrate having a top SOI layer, a middle BOX layer and a bottom substrate layer. The method includes depositing a hard mask layer on the SOI substrate. The method includes forming a trench in the SOI substrate, wherein the trench extends into the substrate layer. The method includes depositing a blocking layer on a top surface of the hard mask layer and on a bottom and sidewalls of the trench. The method includes removing a portion of the blocking layer above the hard mask layer and on the bottom of the trench. The method includes removing the hard mask layer. The method includes removing the remaining portion of the blocking layer on the sidewalls of the trench. The method includes depositing a first conductive material to fill the trench. The method further includes planarizing the first conductive material. The method also includes removing a portion of the first conductive material from the trench, wherein a top surface of the first conductive material is below a bottom surface of the SOI layer and above a top surface of the substrate layer.

In a further aspect of the invention, a method of forming a device includes providing a semiconductor-on-insulator (SOI) substrate having a top SOI layer, a middle BOX layer and a bottom substrate layer. The method includes depositing a pad nitride layer on a top surface of the SOI layer. The method includes depositing a hard mask layer on a top surface of the pad nitride layer. The method includes forming a trench in the SOI substrate, wherein the trench extends into the substrate layer. The method includes depositing a blocking layer on a top surface of the hard mask layer and on a bottom and sidewalls of the trench. The method includes removing a portion of the blocking layer above the hard mask layer and on the bottom of the trench. The method includes removing the hard mask layer. The method includes removing the remaining portion of the blocking layer on the sidewalls of the trench. The method includes depositing a node dielectric layer on a top surface of the pad nitride layer and on a bottom and sidewalls of the trench. The method includes depositing a liner layer on a top surface of the node dielectric layer. The method includes depositing a first conductive material on a top surface of the liner layer to fill the trench. The method includes planarizing the first conductive material. The method further includes removing a portion of the first conductive material from the trench, wherein a top surface of the first conductive material is below a bottom surface of the SOI layer and above a top surface of the substrate layer. The method also includes removing a portion of the node dielectric layer and a portion of the liner layer above the pad nitride liner and a portion of the node dielectric layer and a portion of the liner layer from the sidewalls of the trench above the top surface of the first conductive material.

In a further aspect of the invention a device includes a semiconductor-on-insulator (SOI) substrate having an SOI layer, a BOX layer and a substrate layer. The device includes a pad nitride layer deposited on a top surface of the SOI layer. The device includes a trench formed in the SOI substrate, wherein the trench extends into the substrate layer. The device includes a node dielectric layer deposited on a bottom and sidewalls of the first trench. The device further includes a liner layer deposited on a top surface of the node dielectric layer. The device also includes a first conductive material deposited in the trench, wherein a top surface of the first conductive material is below a bottom surface of the SOI layer and above a top surface of the substrate layer, wherein a top surface of the node dielectric layer and a top surface of the liner layer are coplanar with the top surface of the first conductive material.

In a yet further aspect of the invention, a design structure tangibly embodied in a machine readable medium for designing, manufacturing, or testing an integrated circuit, the design structure includes a semiconductor-on-insulator (SOI) substrate having an SOI layer, a BOX layer and a substrate layer. The design structure includes a pad nitride layer deposited on a top surface of the SOI layer. The design structure includes a trench formed in the SOI substrate, wherein the trench extends into the substrate layer. The design structure includes a node dielectric layer deposited on a bottom and sidewalls of the first trench. The design structure further includes a liner layer deposited on a top surface of the node dielectric layer. The design structure also includes a conductive material deposited in the trench, wherein a top surface of the conductive material is below a bottom surface of the SOI layer and above a top surface of the substrate layer, wherein a top surface of the node dielectric layer and a top surface of the liner layer are coplanar with the top surface of the conductive material.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Disclosed herein is a structure and method for hard mask removal on an SOI substrate without using a chemical mechanical polish (CMP) process. By depositing a blocking material on a hard mask material after a deep trench reactive ion etch (RIE) process and removing the blocking material on top of the hard mask material, a selective wet etch process can be used to remove the hard mask material selectively. The blocking material can be easily removed prior to node dielectric deposition. By implementing a wet etching process to remove the hard mask material, recess depth can be effectively controlled and provide yield improvement of embedded DRAM (eDRAM) devices in 22 nm technology and beyond.

Figure 1:
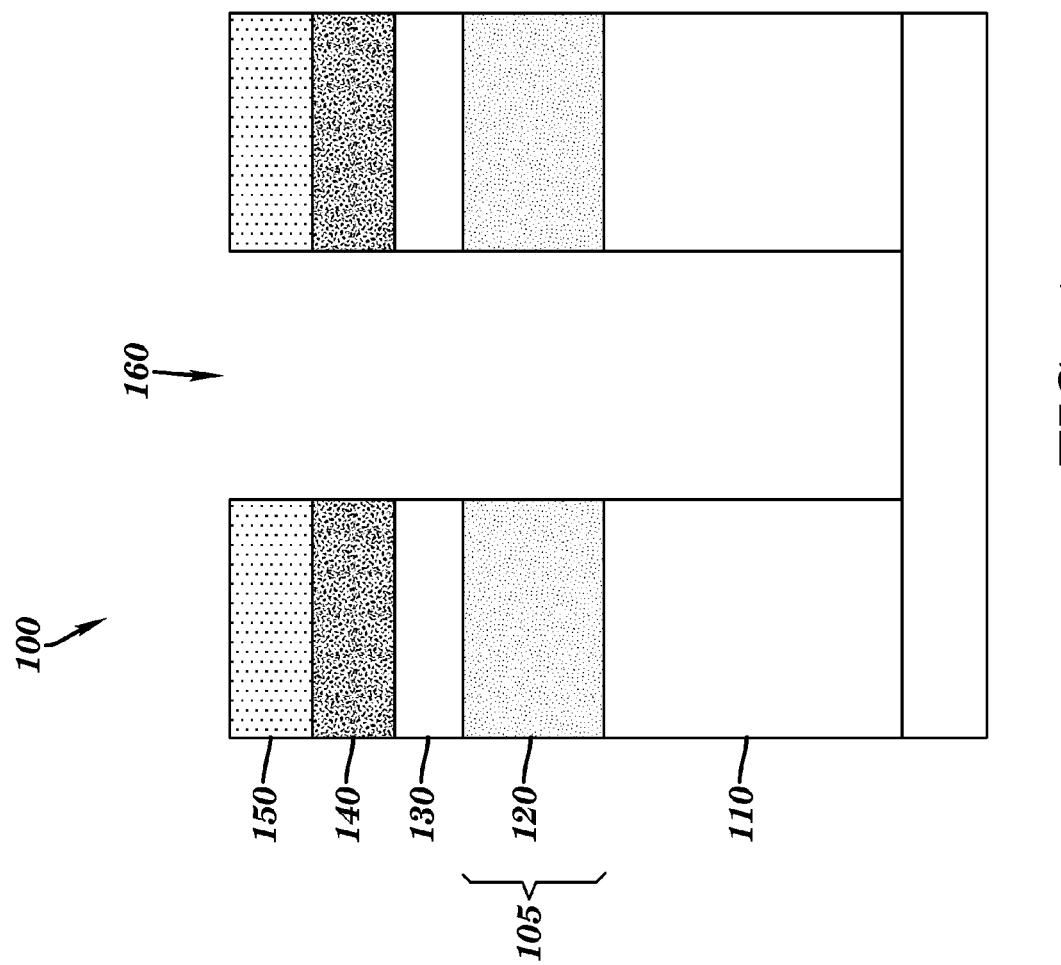
FIG. 1 shows a starting structure and processing steps in accordance with an embodiment of the invention.

FIG. 1 shows a starting structure and processing steps in accordance with an embodiment of the invention. Starting structure 100 includes a semiconductor-on-insulator (SOI) substrate 105. SOI substrate 105 includes a top SOI layer 130, a middle BOX layer 120 and a bottom substrate layer 110. SOI layer 130 may have a thickness in a range from about 100 angstroms to about 1500 angstroms, but can be thinner or thicker. BOX layer 120 may have a thickness in a range from about 900 angstroms to about 1900 angstroms, but can be thinner or thicker. Substrate layer 110 may comprise silicon, epi-silicon or single-crystal silicon or other materials or combinations of materials.

A pad nitride layer 140 is deposited on a top surface of SOI substrate 130. Pad nitride layer 140 may be deposited by conventional deposition methods such as chemical vapor deposition (CVD) or any other known or later developed methods. Pad nitride layer 140 may comprise silicon nitride or other materials or combinations of materials. Pad nitride layer 140 may have a thickness in a range from about 400 angstroms to about 1,600 angstroms, but can be thinner or thicker.

A hard mask layer 150 is deposited on a top surface of pad nitride layer 140. Hard mask layer 150 may be deposited by conventional deposition methods such as CVD or plasma enhanced chemical vapor deposition (PECVD). Hard mask layer 150 may comprise silicon oxide, high density plasma (HDP) oxide, hafnium oxide, borosilicate glass (BSG) oxide, undoped silicate glass (USG) oxide or other materials or combinations of materials. Hard mask layer 150 may have a thickness in a range from about 100 angstroms to about 12,000 angstroms, but can be thinner or thicker. Hard mask layer thickness may be reduced to obtain a better margin of hard mask removal because a deep trench CMP process is not being used.

A trench 160 is formed through hard mask layer 150, pad nitride layer 140 and SOI substrate 105. Trench 160 extends into substrate layer 110. Trench 160 may be formed using conventional etching processes such as RIE.

Figure 2:
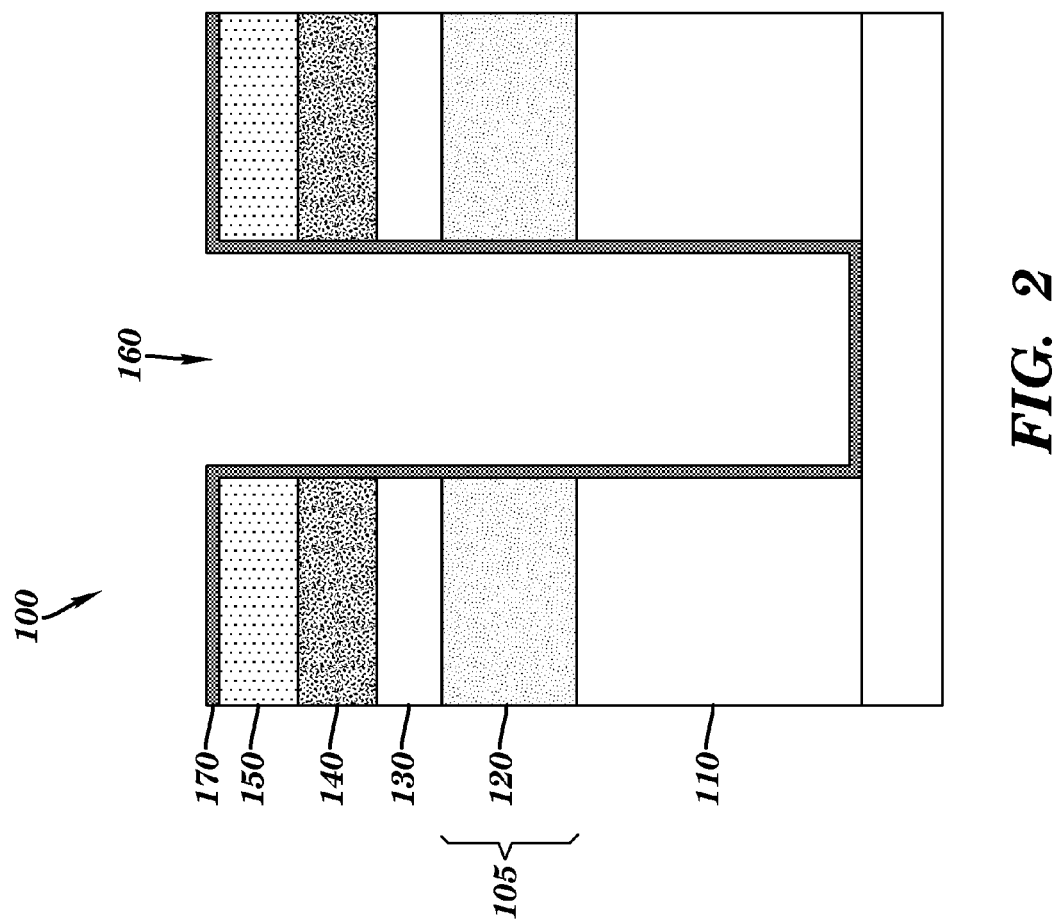
FIGS. 2-8 show processing steps and intermediate structures in accordance with an embodiment of the invention.

Referring to FIG. 2, a blocking layer 170 is deposited on a top surface of hard mask layer 150 and on a bottom and sidewalls of trench 160. Blocking layer 170 may be deposited by conventional deposition methods such as atomic layer deposition (ALD), CVD, low pressure CVD (LPCVD), molecular layer deposition (MLD), PECVD or any other known or later developed methods. Blocking layer 170 may comprise any barrier material such as a nitride, high temperature oxide (HTO), hafnium oxide, hafnium silicon oxide or other materials or combinations of materials that have a high selectivity on oxide. Blocking layer 170 may have a thickness in a range from about 30 angstroms to about 170 angstroms depending upon if only nitride or nitride plus HTO are used, but can be thinner or thicker. HTO may not always be used. Blocking layer 170 protects the sidewalls of BOX layer 120 during the subsequent removal of hard mask layer 150. Hard mask layer 150 has etching selectivity with blocking layer 170.

Figure 3:
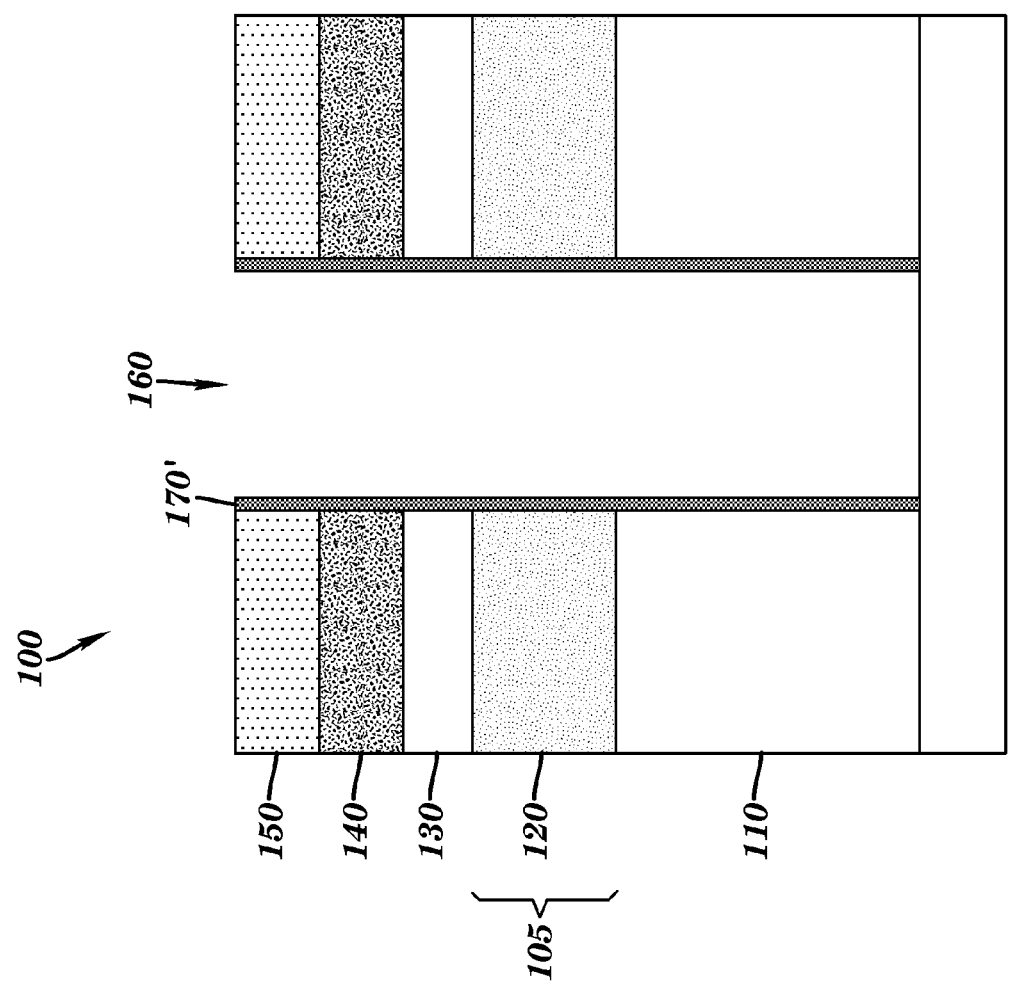

Referring to FIG. 3, a portion of blocking layer 170 is removed above hard mask layer 150 and from the bottom of trench 160 without removing any portion from the sidewalls of trench 160. Blocking layer 170 may be removed by conventional methods such as anisotropic RIE or by using a CMP process. A portion 170' of the blocking layer remains on the sidewalls of trench 160.

Figure 4:
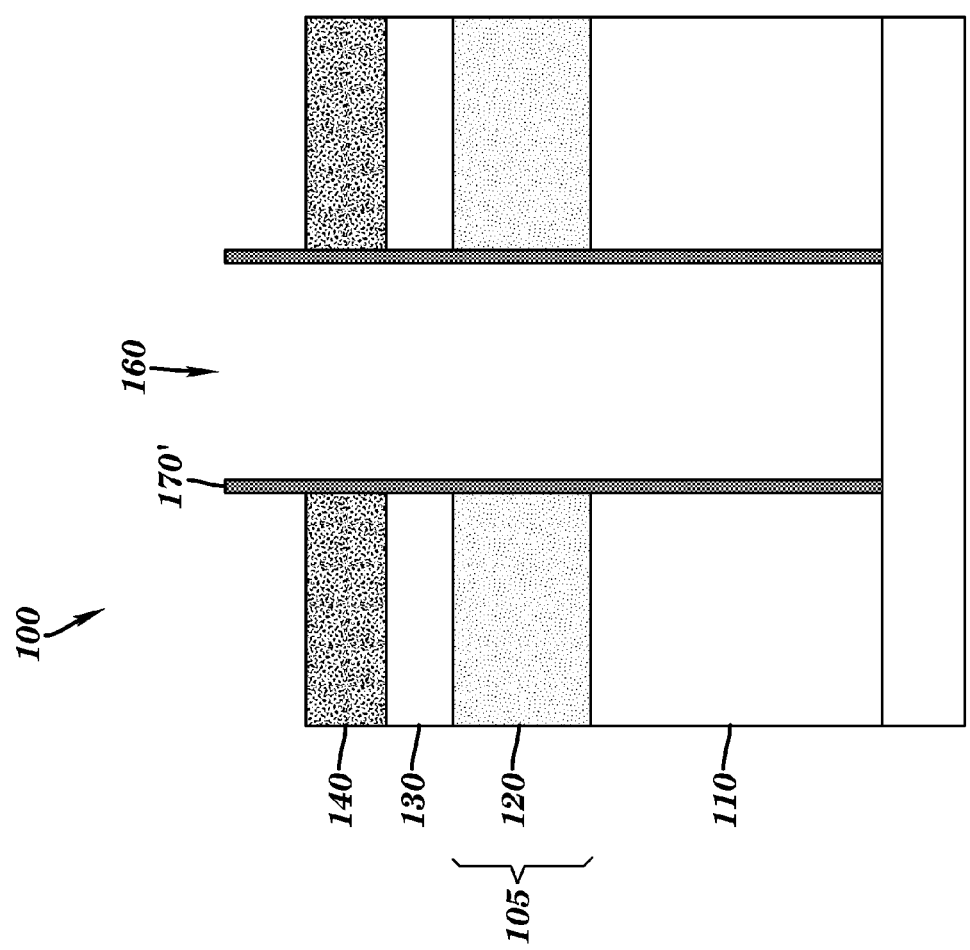

Referring to FIG. 4, hard mask layer 150 is removed. Hard mask layer 150 may be removed by using a selective etch process or any other known or later developed methods. Wet etching which has selectivity between hard mask layer 150 and blocking layer 170' may be used. Hydrofluoric acid (HF), buffered hydrofluoric acid (BHF) or other materials or combinations of materials may be used to remove hard mask layer 150. BOX layer 120 is protected by blocking layer 170' and is not attacked during the etch process. A dry etch process such as RIE may also be used.

Figure 5:
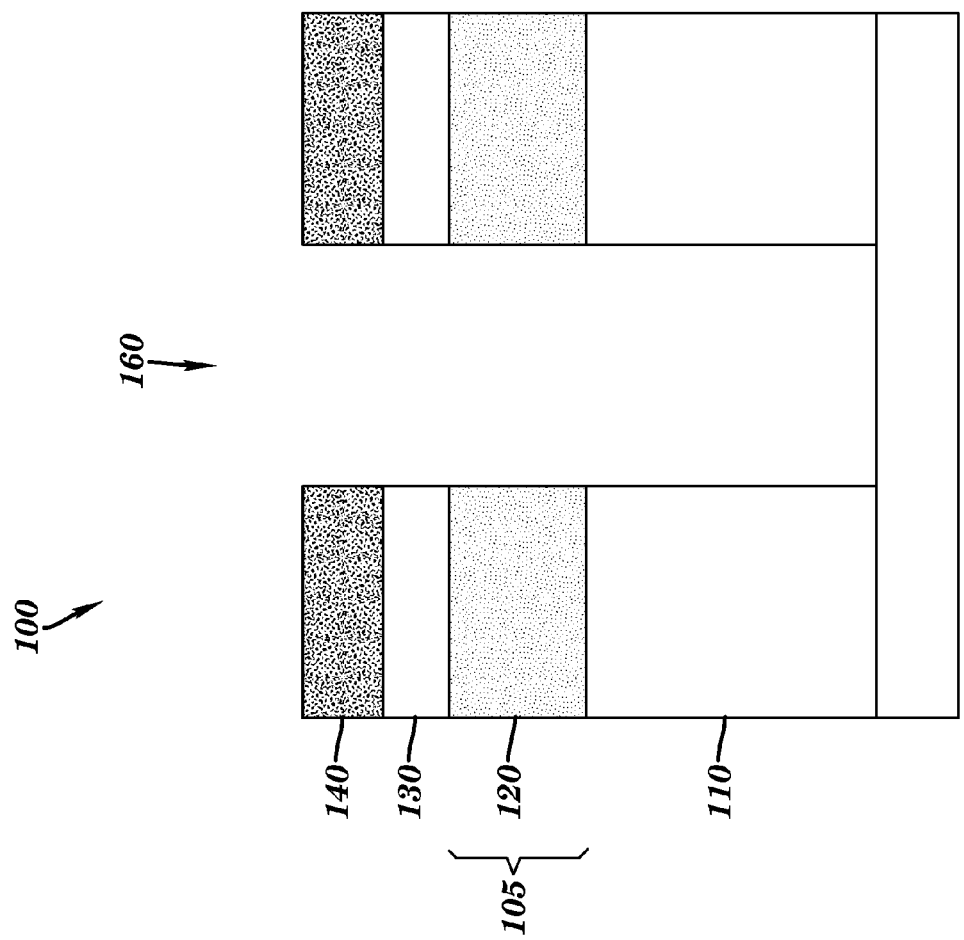

Referring to FIG. 5, the remaining portion 170' of the blocking layer on the sidewalls of trench 160 is selectively removed The remaining portion 170' may be removed by conventional wet or dry etching which has selectivity between pad nitride layer 140, SOI layer 130 and BOX layer 120. Hot phosphoric acid or other materials or combinations of materials may be used to remove the remaining portion 170' of the blocking layer without any loss of SOI layer 130 and BOX layer 120. Materials having less selectivity with pad nitride layer 140 than SOI layer 130 and BOX layer 120 may be used.

Figure 6:
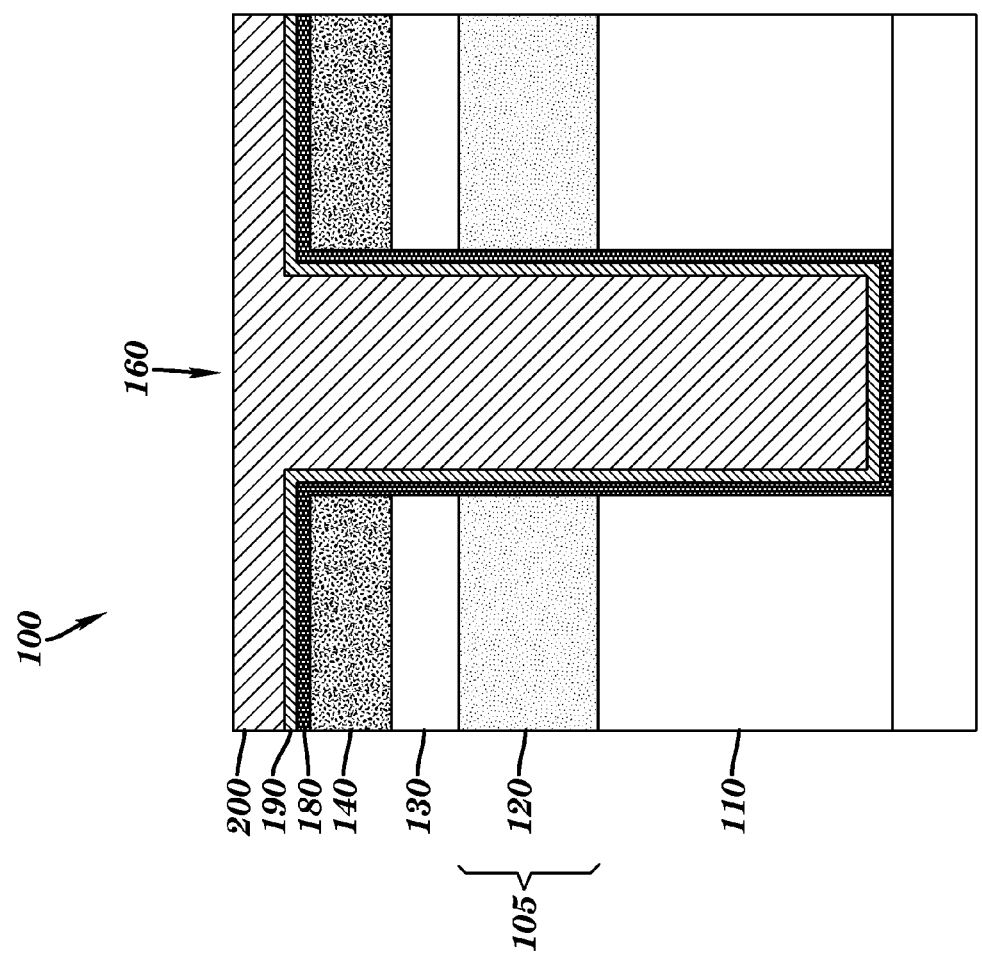

Referring to FIG. 6, a node dielectric layer 180 is deposited on a top surface of pad nitride layer 140 and on a bottom and sidewalls of trench 160. Node dielectric layer 180 may be deposited by conventional deposition methods such as CVD, ALD or any other known or later developed methods. Node dielectric layer 180 may comprise silicon nitride, silicon oxide, oxynitride, high-k dielectric or other materials or combinations of materials. A liner layer 190 is deposited on a top surface of node dielectric layer 180. Liner layer 190 may be deposited by conventional deposition methods such as CVD, ALD, MLD or any other known or later developed methods. Liner layer 190 may comprise titanium nitride, a metal or other materials or combinations of materials. A first conductive material 200 is conformally deposited over liner layer 190 to fill trench 160. First conductive material 200 may be deposited by conventional deposition methods such as CVD or any other known or later developed methods. First conductive material 200 may comprise doped silicon, polysilicon, titanium nitride, a metal or other materials or combinations of materials.

Figure 7:
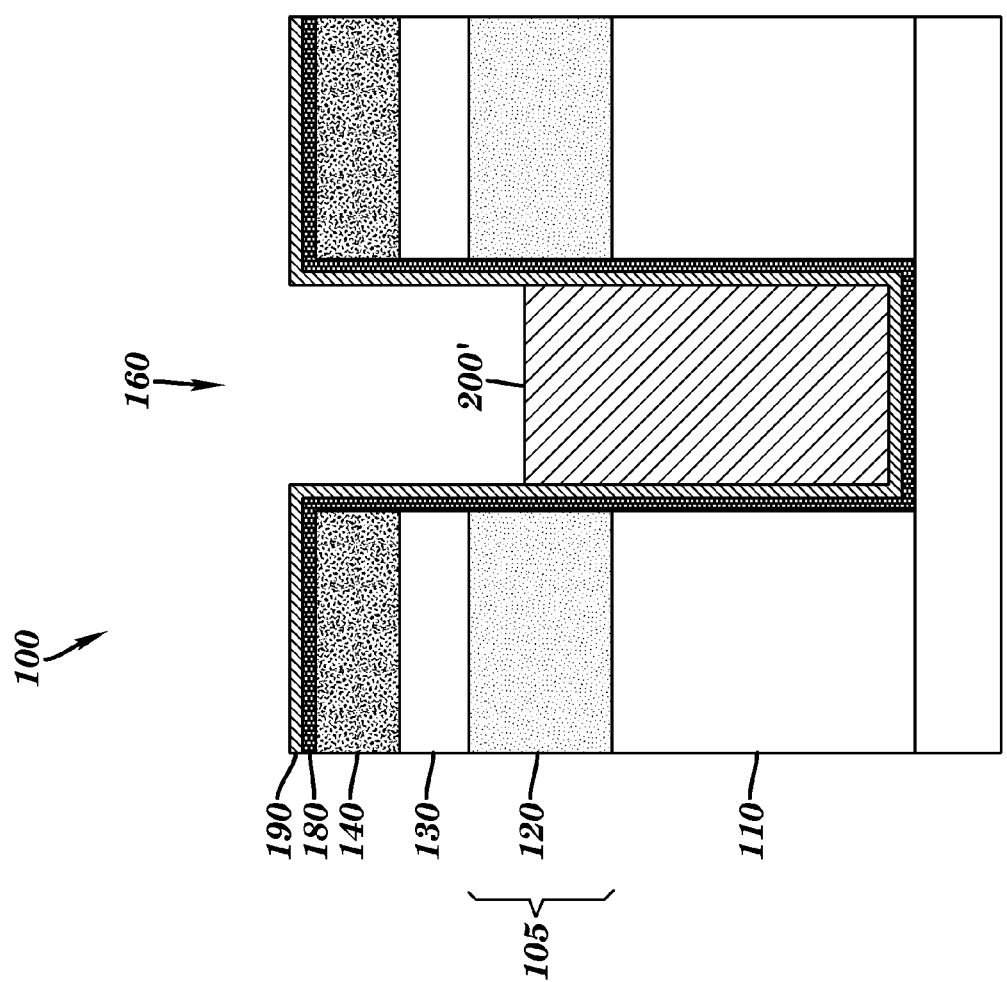

Referring to FIG. 7, first conductive material 200 is planarized and recessed in trench 160. Conventional processes such as CMP or RIE may be used to remove and recess first conductive material 200. Conductive material 200' remains in trench 160. A top surface of remaining conductive material 200' is below a bottom surface of SOI later 130 and above a top surface of substrate layer 110.

Figure 8:
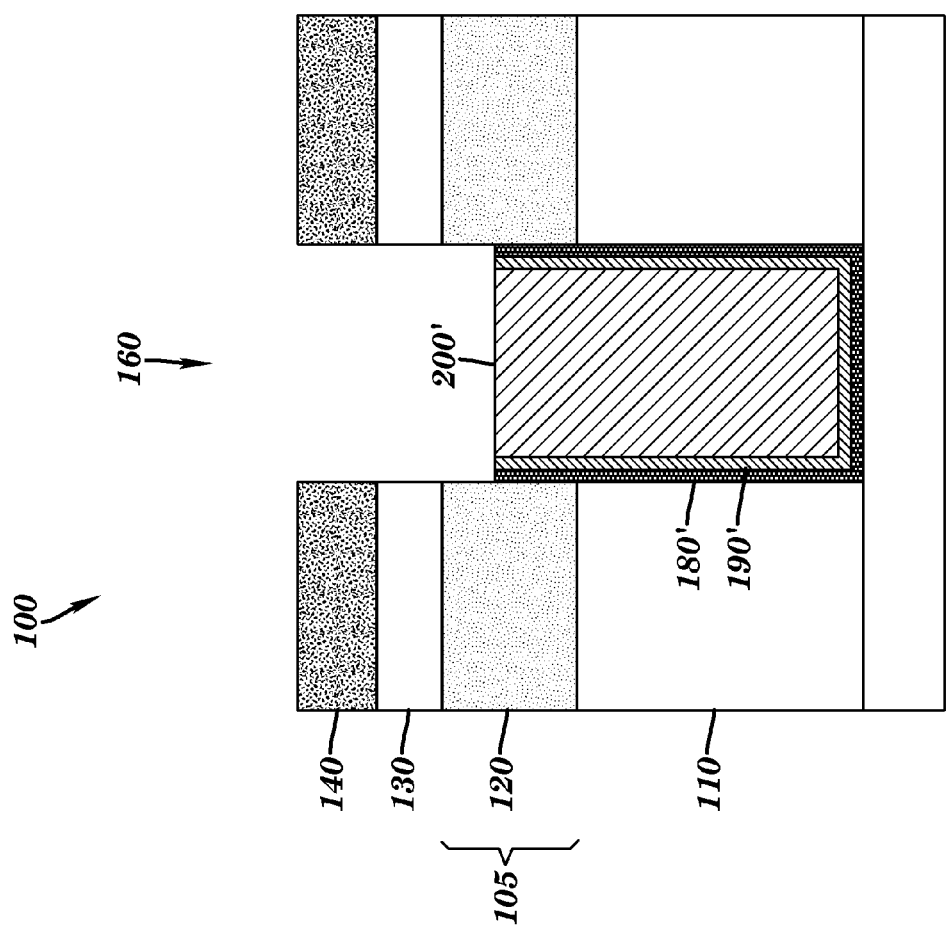

Referring to FIG. 8, a portion of node dielectric layer 180 and liner layer 190 are removed above pad nitride layer 140 and from sidewalls of trench 160 above a top surface of remaining conductive material 200'. Portions of node dielectric layer 180 and liner layer 190 may be removed by conventional methods such as RIE. Portion 180' of the node dielectric layer and portion 190' of the liner layer remain on the sidewalls of trench 160.

Figure 9:
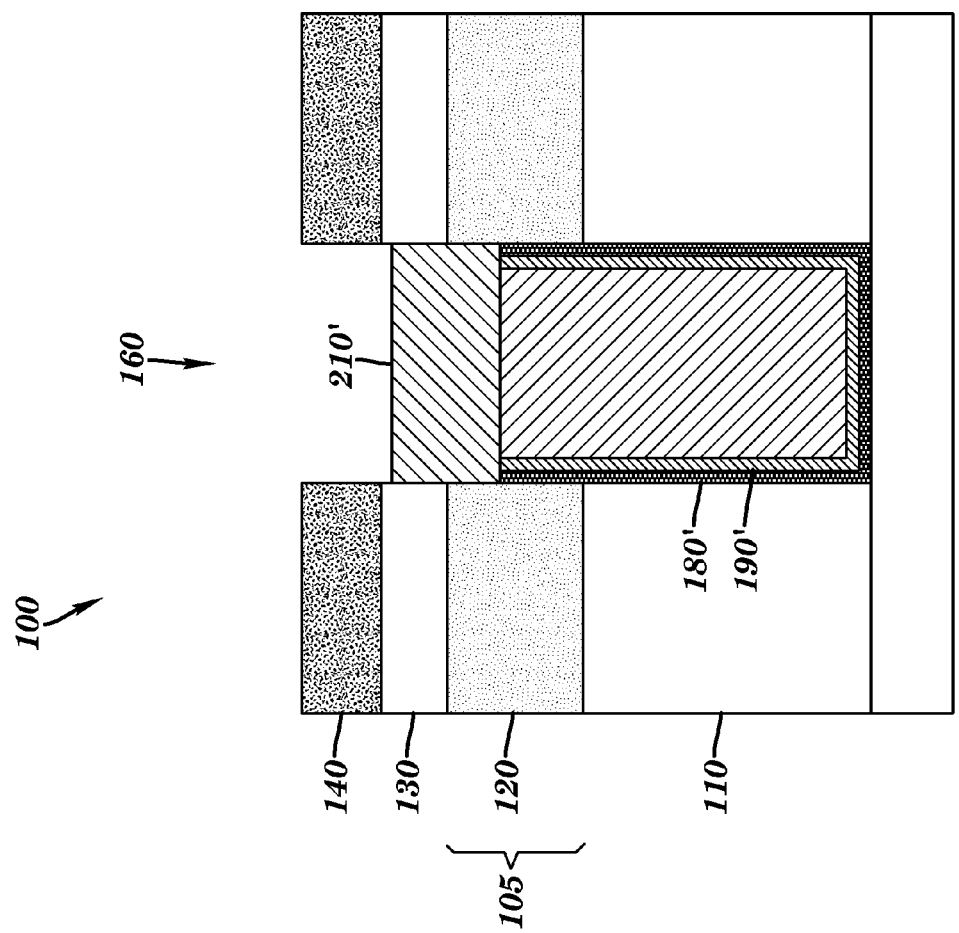
FIG. 9 shows processing steps and a final structure in accordance with an embodiment of the invention.

Referring to FIG. 9, a second conductive material 210 is conformally deposited over pad nitride layer 140 to fill trench 160 (not shown). Second conductive material 210 may be deposited by conventional deposition methods such as CVD or any other known or later developed methods. Second conductive material 210 may comprise doped silicon, polysilicon, titanium nitride, a metal or other materials or combinations of materials. Second conductive material 210 is planarized and recessed in trench 160. Conventional processes such as CMP or RIE may be used to remove and recess second conductive material 210. Conductive material 210' remains in trench 160. Conventional processes may be used to form devices, including eDRAM devices.

Design Structure

Figure 10:
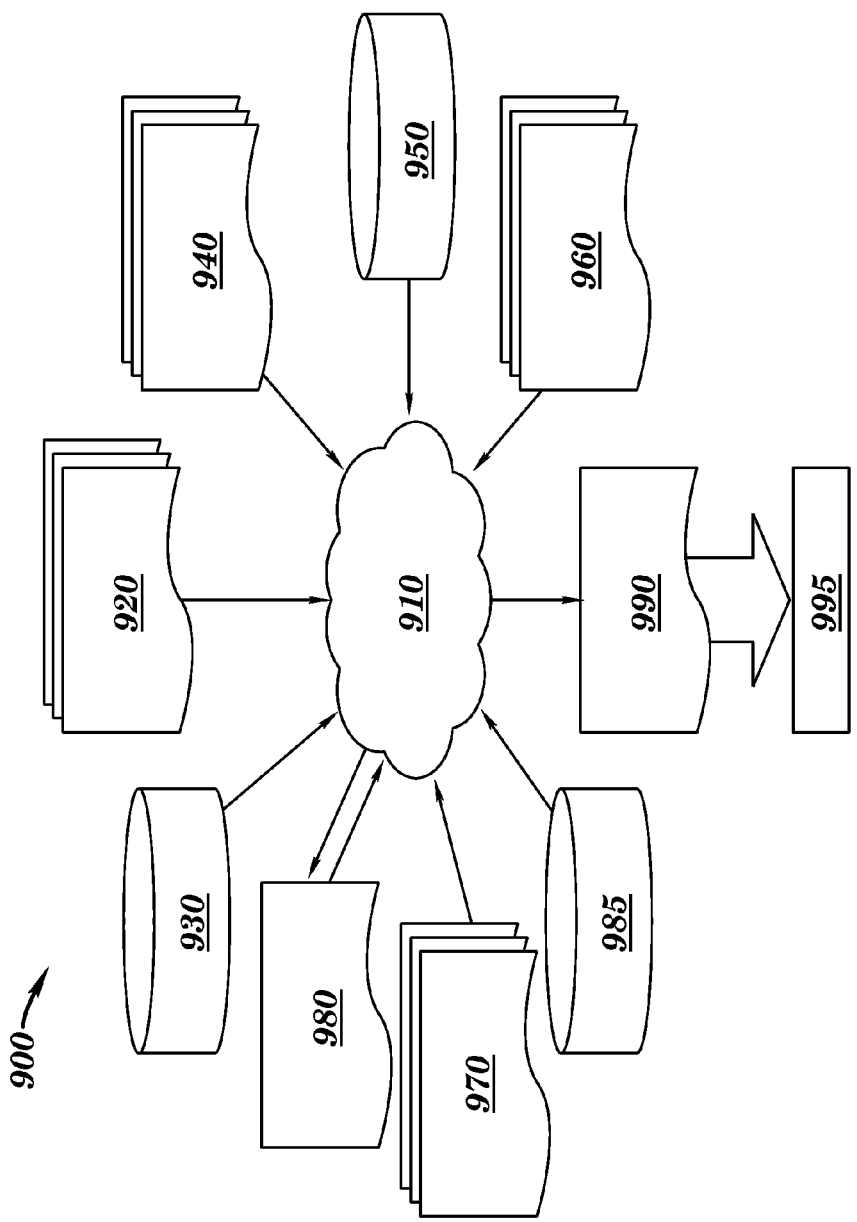
FIG. 10 shows a block diagram of an exemplary design flow used in semiconductor design, manufacturing, and/or test.

FIG. 10 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-9 in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 1-9. Design process 910 preferably synthesizes (or translates) embodiments of the invention as shown in FIGS. 1-9 into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-9, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:
1. A method of forming a device, comprising:
providing a semiconductor-on-insulator (SOI) substrate having a top SOI layer, a middle BOX layer and a bottom substrate layer;
depositing a hard mask layer on the SOI substrate;
forming a trench in the SOI substrate, wherein the trench extends into the substrate layer;
depositing a blocking layer on a top surface of the hard mask layer and on a bottom and sidewalls of the trench;
removing a portion of the blocking layer above the hard mask layer and on the bottom of the trench;
removing the hard mask layer;
removing the remaining portion of the blocking layer on the sidewalls of the trench;
depositing a first conductive material to fill the trench;

planarizing the first conductive material; and
removing a portion of the first conductive material from the trench, wherein a top surface of the first conductive material is below a bottom surface of the SOI layer and above a top surface of the substrate layer.

2. The method according to claim 1, further comprising depositing a second conductive material in the trench on the top surface of the first conductive material, planarizing the second conductive material and removing a portion of the second conductive material from the trench.

3. The method according to claim 1, wherein the blocking layer comprises a nitride.

4. The method according to claim 1, wherein the removing a portion of the blocking layer step comprises performing a RIE.

5. The method according to claim 1, wherein the removing the hard mask layer step comprises performing a selective wet etching process.

6. The method according to claim 1, wherein the removing the remaining portion of the blocking layer step comprises performing a wet etching process.

7. A method of forming a device, comprising:
providing a semiconductor-on-insulator (SOI) substrate having a top SOI layer, a middle BOX layer and a bottom substrate layer;
depositing a pad nitride layer on a top surface of the SOI layer;
depositing a hard mask layer on a top surface of the pad nitride layer;
forming a trench in the SOI substrate, wherein the trench extends into the substrate layer;
depositing a blocking layer on a top surface of the hard mask layer and on a bottom and sidewalls of the trench;
removing a portion of the blocking layer above the hard mask layer and on the bottom of the trench;
removing the hard mask layer;
removing the remaining portion of the blocking layer on the sidewalls of the trench;
depositing a node dielectric layer on a top surface of the pad nitride layer and on a bottom and sidewalls of the trench;
depositing a liner layer on a top surface of the node dielectric layer;
depositing a first conductive material on a top surface of the liner layer to fill the trench;
planarizing the first conductive material;
removing a portion of the first conductive material from the trench, wherein a top surface of the first conductive material is below a bottom surface of the SOI layer and above a top surface of the substrate layer; and
removing a portion of the node dielectric layer and a portion of the liner layer above the pad nitride liner and a portion of the node dielectric layer and a portion of the liner layer from the sidewalls of the trench above the top surface of the first conductive material.

8. The method according to claim 7, further comprising depositing a second conductive material in the trench on the top surface of the first conductive material, planarizing the second conductive material and removing a portion of the second conductive material from the trench.

9. The method according to claim 7, wherein the second conductive material comprises doped silicon.

10. The method according to claim 7, wherein the forming a trench in the SOI substrate step comprises performing a reactive ion etch (RIE).

11. The method according to claim 7, wherein the blocking layer is deposited by atomic layer deposition (ALD), chemical vapor deposition (CVD), low pressure CVD (LPCVD), molecular layer deposition (MLD) or plasma enhanced chemical vapor deposition (PECVD).

12. The method according to claim 7, wherein the blocking layer comprises a nitride.

13. The method according to claim 7, wherein the blocking layer comprises a high temperature oxide (HTO).

14. The method according to claim 7, wherein the blocking layer comprises a nitride and a high temperature oxide (HTO).

15. The method according to claim 7, wherein the blocking layer has a thickness in a range from about 30 angstroms to about 170 angstroms.

16. The method according to claim 7, wherein the removing a portion of the blocking layer step comprises performing a RIE.

17. The method according to claim 7, wherein the removing the hard mask layer step comprises performing a selective wet etching process.

18. The method according to claim 7, wherein the removing the remaining portion of the blocking layer step comprises performing a wet etching process.

19. The method according to claim 7, wherein the first conductive material comprises one of polysilicon and titanium nitride.

20. The method according to claim 7, wherein the planarizing the first conductive material step comprises performing a chemical mechanical polishing (CMP).

* * * * *